United States Patent [19]
Kepler

[11] Patent Number: 6,030,862
[45] Date of Patent: Feb. 29, 2000

[54] DUAL GATE OXIDE FORMATION WITH MINIMAL CHANNEL DOPANT DIFFUSION

[75] Inventor: Nick Kepler, Saratoga, Calif.

[73] Assignee: Advanced Micro Devices, Inc., Sunnyvale, Calif.

[21] Appl. No.: 09/170,060

[22] Filed: Oct. 13, 1998

[51] Int. Cl.[7] .................................. H01L 21/8238
[52] U.S. Cl. ................ 438/217; 438/275; 438/276; 438/289; 438/290; 438/291
[58] Field of Search ........................ 438/275, 217, 438/276, 289, 290, 291, FOR 68, FOR 204, FOR 216, FOR 217, FOR 218

[56] References Cited

U.S. PATENT DOCUMENTS

| | | | |
|---|---|---|---|
| 4,554,644 | 11/1985 | Chen et al. | 365/154 |
| 4,651,406 | 3/1987 | Shimizu et al. | 29/571 |
| 5,254,489 | 10/1993 | Nakata . | |
| 5,283,200 | 2/1994 | Okamoto . | |
| 5,393,677 | 2/1995 | Lien et al. . | |
| 5,407,841 | 4/1995 | Liao et al. . | |
| 5,497,021 | 3/1996 | Tada | 257/369 |
| 5,502,009 | 3/1996 | Lin . | |
| 5,571,745 | 11/1996 | Horiuchi . | |
| 5,576,226 | 11/1996 | Hwang . | |
| 5,661,045 | 8/1997 | Manning et al. | 438/286 |
| 5,674,788 | 10/1997 | Wristers et al. . | |
| 5,698,458 | 12/1997 | Hsue et al. . | |
| 5,716,863 | 2/1998 | Arai . | |
| 5,716,864 | 2/1998 | Abe . | |
| 5,741,719 | 4/1998 | Kim . | |
| 5,747,368 | 5/1998 | Yang et al. | 438/217 |
| 5,759,881 | 6/1998 | Manning | 438/199 |

*Primary Examiner*—Wael Fahmy
*Assistant Examiner*—Long Pham

[57] ABSTRACT

Sharply-defined dopant profiles in the transistor channel region of ultra high density semiconductor devices are maintained by selective transistor channel implants to reduce exposure to heat cycling, thereby reducing dopant diffusion. Embodiments include forming isolation regions on a semiconductor substrate, forming a relatively thick first gate dielectric layer, then performing transistor channel implantations. The first gate dielectric layer is then masked and etched, and a second, thinner gate dielectric layer is formed. The transistor channel implants are not affected by the temperature cycle of the first gate dielectric layer formation, thereby enabling dual gate dielectric formation without adversely affecting the electrical characteristics of the finished device.

20 Claims, 6 Drawing Sheets

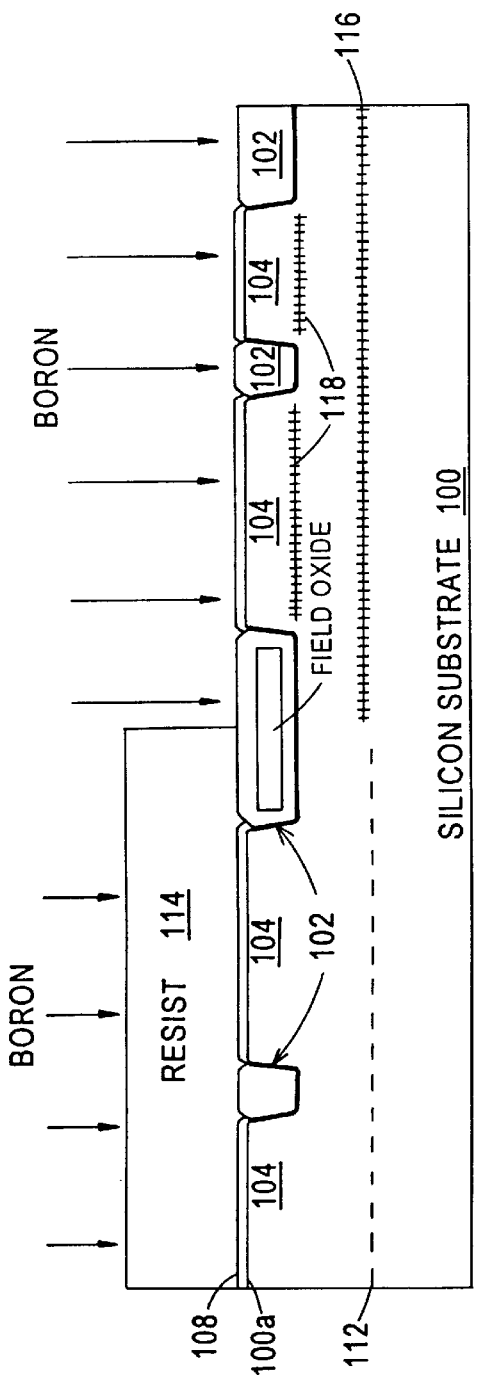
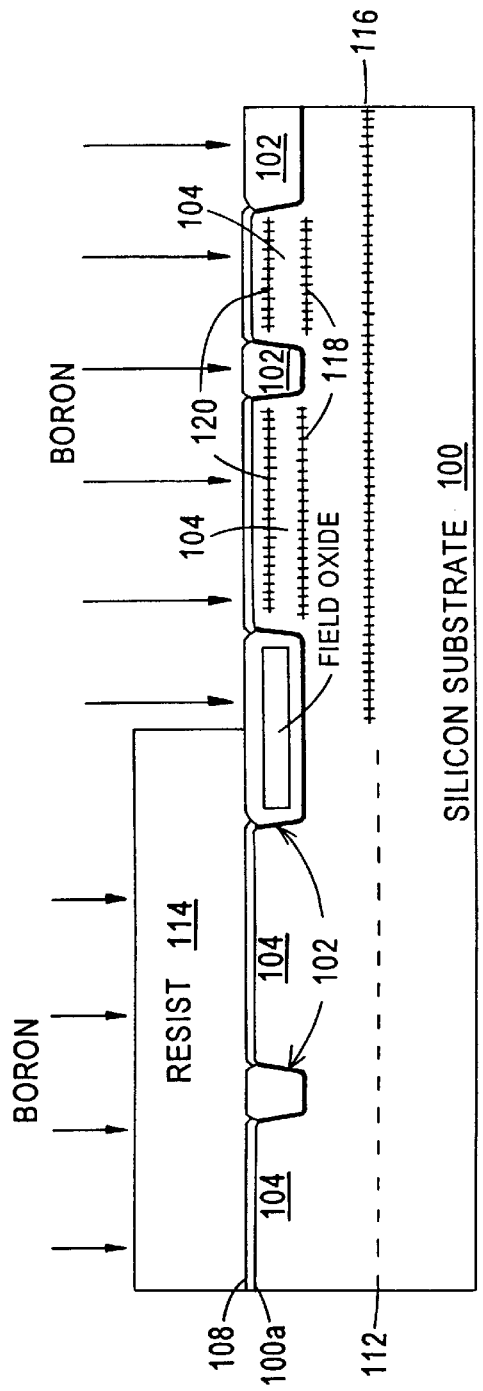

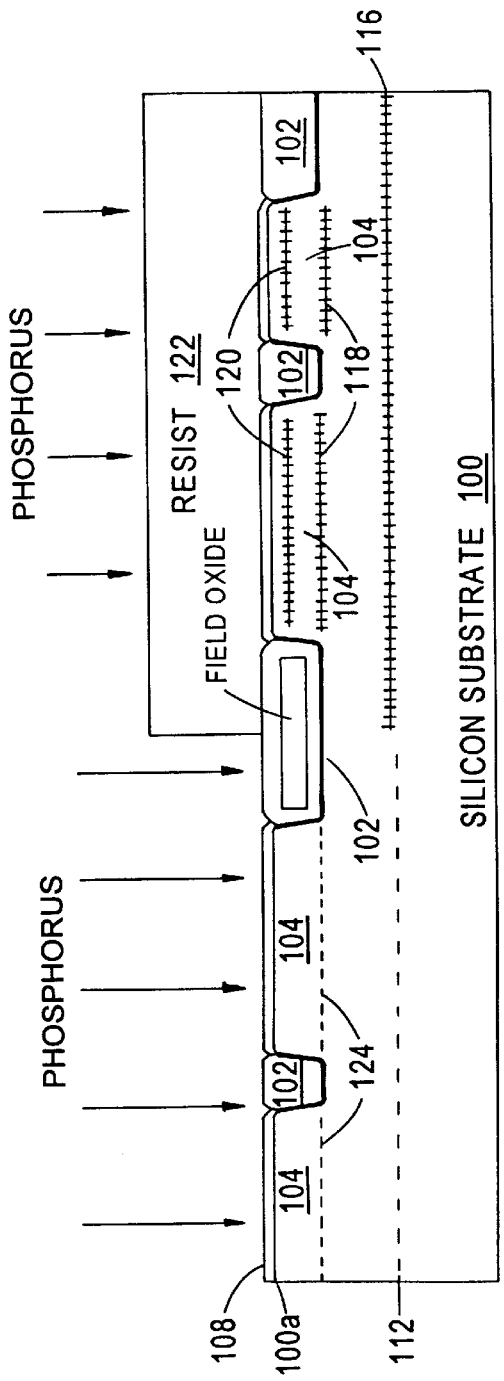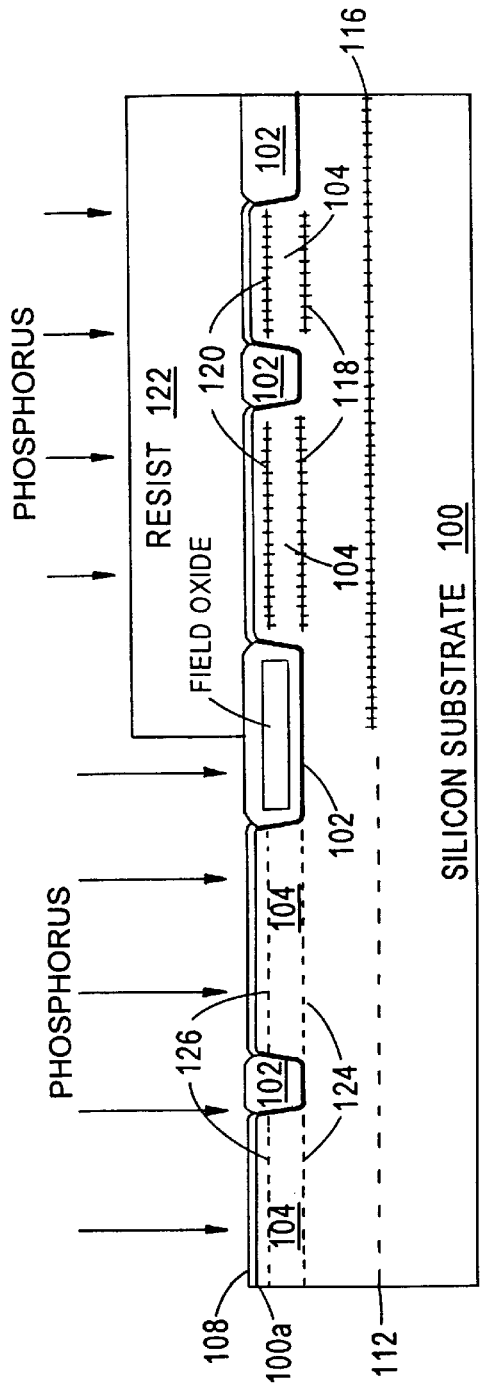

DUAL GATE OXIDE FORMATION WITH MINIMAL CHANNEL DOPANT DIFFUSION

FIELD OF THE INVENTION

The present invention relates to a method of manufacturing a semiconductor device with transistors comprising gate oxide layers of differing thicknesses. The present invention has particular applicability in manufacturing high density semiconductor devices with submicron design features and dual gate oxide thicknesses.

BACKGROUND ART

Complementary metal oxide semiconductor (CMOS) technologies have traditionally employed a gate dielectric, usually a silicon dioxide layer called a "gate oxide" layer, of a single thickness in forming all the CMOS transistors on a substrate. To meet the demand for increased transistor switching speeds, the gate oxide thickness has been decreased, while gate oxide processing techniques have been improved and power supply voltages have been lowered to maintain acceptable gate oxide reliability.

Current demands for high density and performance require design rules of about 0.25 microns and under in certain devices such as microprocessors, nonvolatile memories and programmable logic circuits. Such high density demands have accelerated reduction in gate oxide thickness (and therefore in power supply voltage) to a greater extent than in other semiconductor devices with which they may be associated; e.g., other devices on a personal computer motherboard. However, some transistors formed on the same substrate as microprocessors, memories or programmable logic circuits, such as transistors in input/output (I/O) circuits, must communicate with devices operating at a higher voltage and, therefore, must withstand a higher voltage.

One approach to this problem is to use a dual-cascaded I/O circuit design to spread the higher I/O voltage across two transistors, thereby providing adequate gate oxide reliability even with the thin gate oxide of the microprocessor, memory or programmable logic circuits. Unfortunately, as feature sizes of microprocessors, etc. shrink to 0.18 $\mu$m and below, the correspondingly thinner gate oxide of these devices (e.g. less than 30 Å) and their lower operating voltage (e.g. 1.5 volts) are incompatible with the I/O voltage (e.g. 3.3 volts) of other, higher voltage devices, even if a dual-cascade I/O design is employed. It is possible to employ a triple-cascade I/O design, but such a design is disadvantageous because it consumes significant amounts of valuable space on the wafer.

To avoid the limitations of cascaded I/O circuit design, some CMOS devices with extremely fine features (e.g. 0.18 $\mu$m or less) utilize a "dual gate oxide" approach, wherein the gate oxide of I/O circuits is thicker than the gate oxide of the remainder of the transistors on the substrate. According to this technique, field isolation areas are formed on the substrate to define active areas, and then transistor channel implants are performed, such as well implants, field implants, punchthrough implants and threshold adjust implants. A first, thick gate oxide is formed, as by thermal oxidation, over the active areas to a thickness of, e.g., about 50 Å, then the thick gate oxide is masked and etched to remove it from the portions of the active areas that are to have a thinner gate oxide. A second, thinner gate oxide is then formed, as by thermal oxidation, on the active areas to a thickness of, e.g., about 30 Å, resulting in transistors having two different thicknesses of gate oxide on the same wafer.

Devices with small feature sizes, such as 0.18 $\mu$m or less, require sharply defined dopant profiles in their channel regions to optimize transistor speed and short-channel effects. To maintain these sharply defined profiles, temperature cycles must be minimized after the transistor channel dopants are implanted. Disadvantageously, the extra gate oxidation step in the dual gate oxide process flow described above diffuses the previously implanted channel dopants to such an extent that the channel doping profile is disturbed, thereby adversely affecting the electrical characteristics of the finished device.

There exists a need for a method of manufacturing a semiconductor device having transistors with differential gate oxide thicknesses wherein the channel doping profile is not adversely affected, particularly in semiconductor devices having a design rule of less than about 0.18 $\mu$m.

SUMMARY OF THE INVENTION

An advantage of the present invention is a method of manufacturing a semiconductor device having transistors with two different gate dielectric thicknesses while maintaining sharply defined dopant profiles of transistor channel implants.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a field oxide region to isolate an active area on a main surface of a semiconductor substrate; forming a first gate dielectric layer on the active area; implanting impurities into the substrate through the first gate dielectric layer; forming a mask on the first gate dielectric layer, the mask having openings over portions of the active area; etching the first gate dielectric layer to expose the portions of the active area; and forming a second gate dielectric layer on the exposed portions of the active area to a thickness less than a thickness of the first gate dielectric layer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 1A–1K schematically illustrate sequential phases of a method in accordance with an embodiment of the present invention.

DESCRIPTION OF THE INVENTION

Figure 1A:
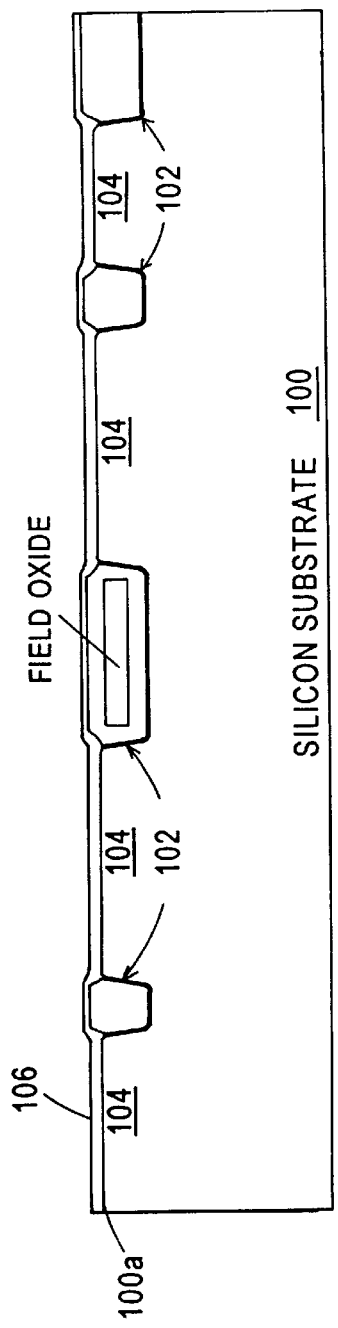

Conventional dual gate dielectric methodologies subject the transistor channel implants to plural heat cycling, thereby disturbing the desired sharply defined doping profiles, resulting in a dimunition of device characteristics. The present invention addresses and solves problems stemming from such heat cycling of the transistor channel dopants in conventional manufacturing processes.

According to the methodology of the present invention, active regions where source/drain and channel areas are to be formed are electrically isolated by the formation of a conventional field isolation. As used throughout the present disclosure and claims, the term "substrate" denotes a semiconductor substrate or an epitaxial layer formed on the semiconductor substrate. A first gate dielectric layer is then formed, as by thermal oxidation or deposition, on the active areas. The substrate is then implanted with impurities through the first gate dielectric layer to form transistor channel implants (i.e., well implants, field implants, punch-through implants and threshold adjust implants), such as by ion implantation. The first gate dielectric layer is then masked and etched away from the portions of the active areas that are to have a thinner gate dielectric. A second gate oxide layer, thinner than the first gate dielectric layer, is then formed, as by thermal oxidation, on the active areas to complete the gate dielectric formation process.

The present invention avoids unduly disturbing the transistor channel doping profile by performing the transistor channel implantations after the formation of the first gate dielectric layer. The transistor channel implants are, therefore, not affected by the temperature cycle of the first gate dielectric layer formation. They are exposed only to the temperature cycle for forming the second, thinner gate dielectric layer, which is necessarily shorter and/or performed at a lower temperature than the temperature cycle necessary to form the first gate dielectric layer, and is the same or less severe than the temperature cycle they would have been exposed to during a conventional single gate dielectric manufacturing process. Thus, the present invention provides a dual gate dielectric formation process without adversely affecting the performance of the finished device.

Furthermore, although impurity implantation through a gate dielectric layer can degrade the quality of the gate dielectric layer, the transistor channel implantation of the present methodology is performed through the thick gate dielectric layer (i.e., the layer that will subsequently be part of the I/O gate dielectric), whose integrity is not as critical as the thin gate dielectric (i.e., the microprocessor gate dielectric), and whose reliability is inherently greater than that of the thin gate dielectric by virtue of its thickness. Therefore, the present methodology's implantation through the I/O gate dielectric will not adversely affect the performance of the completed I/O circuits.

An embodiment of the present invention is illustrated in FIGS. 1A–1K, wherein sequential phases in forming a semiconductor device in accordance with the present invention are depicted. Referring to FIG. 1A, field oxide regions 102 are formed to electrically isolate active areas 104 where source/drain and transistor channel areas are to be formed on a main surface of a semiconductor substrate 100. Field oxide regions 102 are formed, for example, by etching shallow trenches in substrate 100, thermally growing an oxide liner on the trench walls, then refilling the trench with an insulating material. The resulting structure is referred to as a shallow trench isolation (STI) structure. Alternatively, field oxide regions 102 can be formed by heating substrate 100 with field oxide regions 102 exposed to an oxidizing gas, such as oxygen, in a technique known as local oxidation of silicon (LOCOS).

Figure 1B:
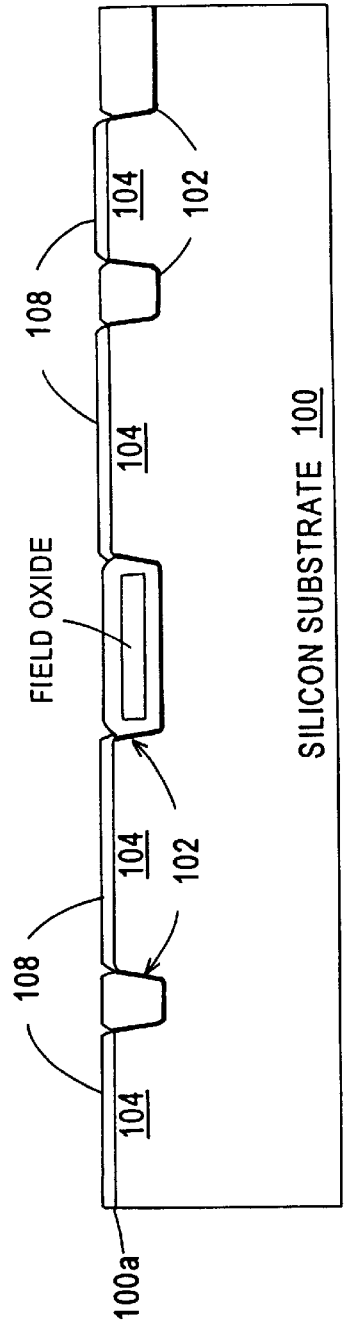

Next, a cleaning step is carried out, and a thin oxide layer 106, called a sacrificial oxide layer, is grown on main surface 100a to alter the shape of the edges of field oxide regions 102 to improve the quality of the edges of the subsequently formed gate dielectric. As depicted in FIG. 1B, sacrificial oxide layer 106 is removed from active areas 104, as by a hydrofluoric acid (HF) dip, and a first gate dielectric layer 108 is formed on active areas 104, such as silicon dioxide by thermal oxidation, silicon dioxide by LPCVD, silicon nitride by LPCVD or tantalum oxide. First gate dielectric layer 108 will ultimately be part of the thicker of the dual gate dielectric layers.

Figure 1C:
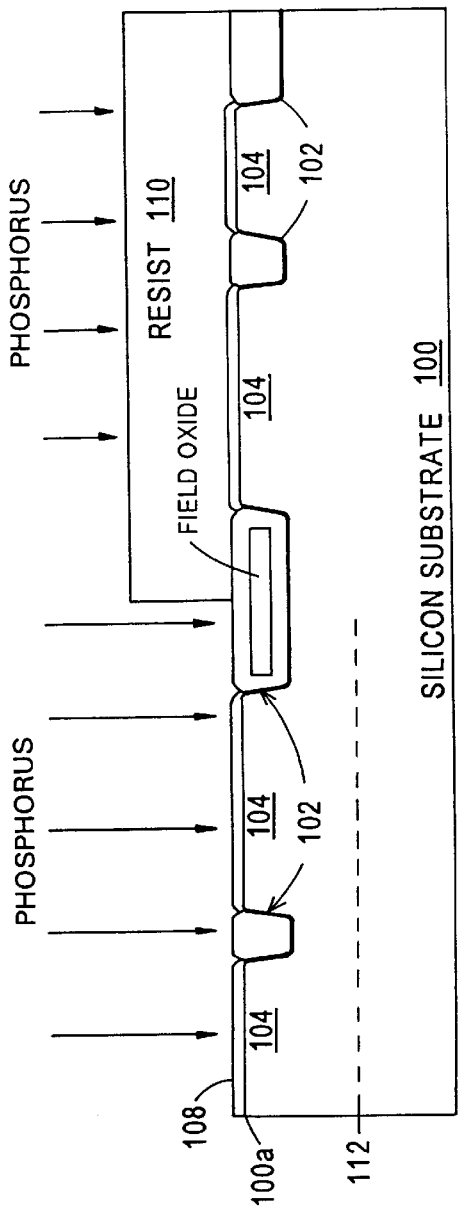

Referring now to FIG. 1C, impurities such as phosphorus are implanted, as by ion implantation, deep into substrate 100 to form n-well implant 112 after formation of photoresist mask 110. Well implants set the background doping for subsequently formed devices. Well implants are typically doped lightly enough so they do not interfere with electrical activity at main surface, and heavily enough to create a low-resistance path deep in substrate to facilitate substrate current flow.

Figure 1D:
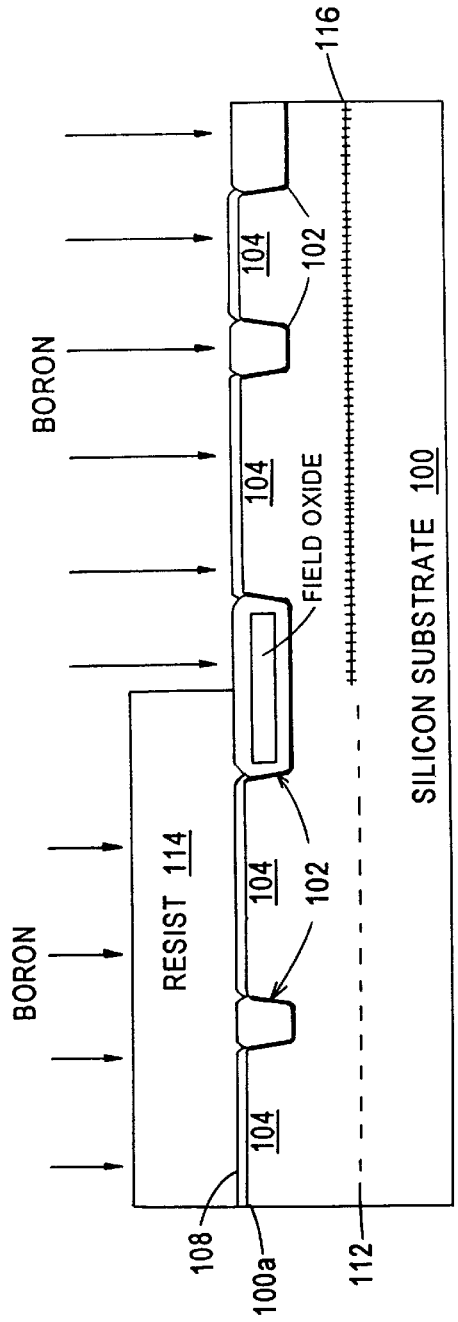

As shown in FIG. 1D, mask 110 is then removed and impurities such as boron are implanted into substrate 100, as by ion implantation, to form n-channel field implant 116 after photoresist mask 114 is formed to block implantation of n-well areas. Field implants, which are implanted into a substrate below field oxide regions, optimize isolation of active areas. In this example, n-channel field implant 116 is implanted deep enough to serve a dual purpose as a p-well implant. However, a separate p-well implant could be performed instead.

Next, as shown in FIG. 1E, impurities such as boron are implanted into substrate 100, as by ion implantation, to form an n-channel punch-through implant 118 above n-channel field implant 116. Punch-through implants under a transistor's channel region prevent leakage between its source/drain regions in the active areas remote from the substrate surface; i.e., where their depletion spreads are not controlled by the transistor's gate, and therefore may contact each other. Punch-through implants gain importance as transistors shrink and source/drain regions become closer together, thereby increasing the chance of leakage.

Referring to FIG. 1F, impurities such as boron are then implanted into substrate 100, as by ion implantation, to form a shallow n-channel threshold adjust implant 120 near main surface 100a. Threshold adjust implants are crucial to the performance of the finished device, as they play a large role in determining the gate voltage at which conductance between the source/drain regions begins.

As shown in FIGS. 1G and 1H, mask 114 is removed and another photoresist mask 122 is formed over areas previously implanted with boron. Impurities such as phosphorous are then implanted, as by ion implantation, to form p-channel punch-through implant 124 and p-channel threshold adjust implant 126. Mask 122 is then removed.

Figure 1I:
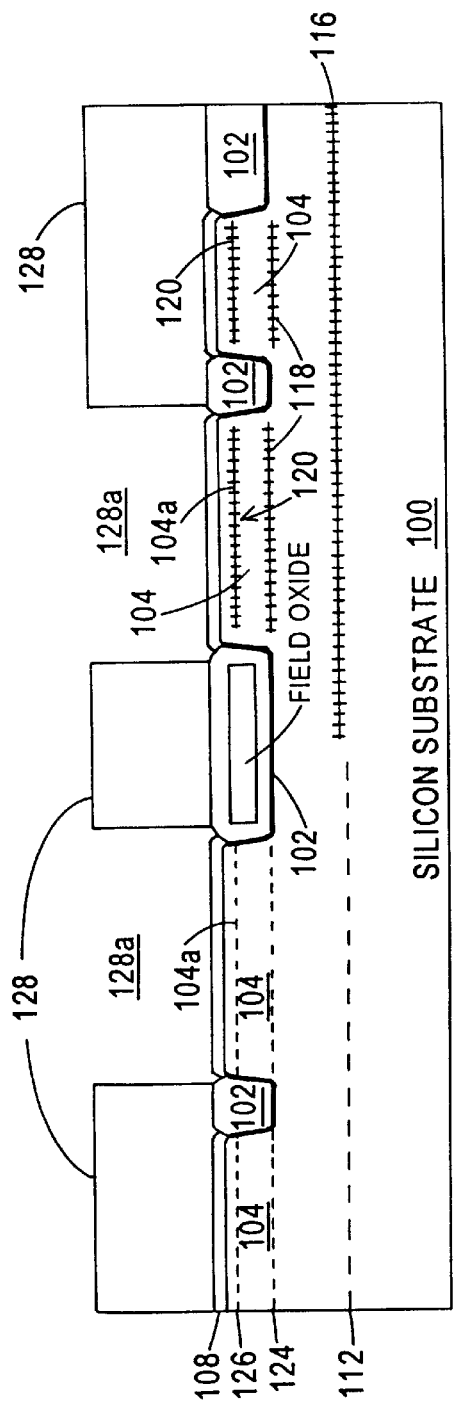
Figure 1J:
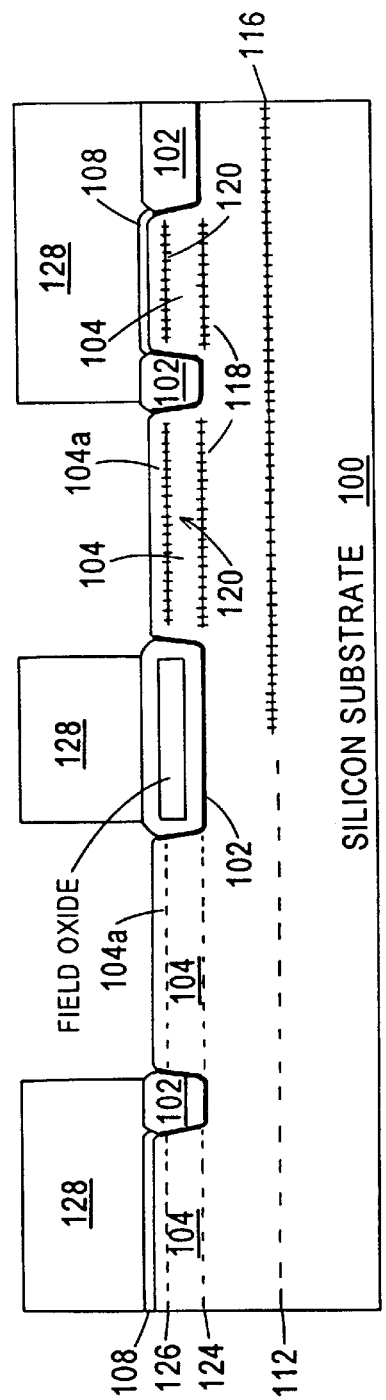

Referring to FIG. 1I, photoresist mask 128 is next formed on first gate dielectric layer 108. Mask 128 has openings 128a over portions 104a of active areas 104 which are to have a thinner gate dielectric than first gate dielectric layer 108. First gate dielectric layer 108 is then etched to expose portions 104a of active areas 104 (see FIG. 1J). Mask 128 is then removed, and a cleaning step is carried out, including an HF dip.

Figure 1K:
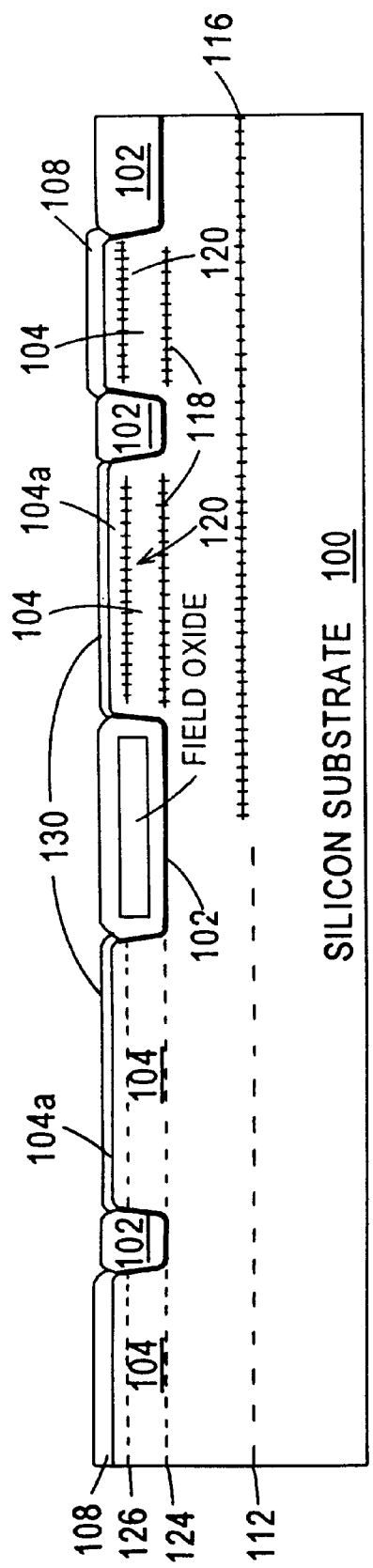

As shown in FIG. 1K, a second gate dielectric layer 130 is formed of the same material as first dielectric layer 108 on exposed portions 104a of active area 104 and first gate dielectric layer 108, to a thickness less than the thickness of first gate dielectric layer 108. For example, the first and second gate dielectric layers 108, 130 can both be silicon dioxide thermally grown in an oxygen atmosphere, or the two growth processes can be separately tailored to improve the quality of both gate dielectric layers; e.g., first gate dielectric layer 108 can be grown in an oxygen atmosphere, while second gate dielectric layer 130 can be grown in a nitrous oxide ($N_2O$) atmosphere or in a two-step process of an initial oxygen atmosphere followed by an $N_2O$ atmosphere. For example, second dielectric layer 130 can be initially grown at about 800° C. to about 1000° C. for about 20 sec to about 10 minutes in an approximately 20% oxygen atmosphere (e.g., 900° C. for about 1.5 minutes), then for about 2 minutes to about 45 minutes in an approximately 50% $N_2O$ atmosphere (e.g., 900° C. for about 10 minutes) to complete its formation.

First gate dielectric layer 108 is thicker than second gate dielectric layer 130, and so is formed using a longer and/or higher temperature cycle than second gate dielectric layer 130; for example, if gate dielectric layers 108, 130 are thermally grown, about 800° C. to about 1000° C. for about 2 minutes to about 45 minutes to form first gate dielectric layer 108 (e.g. about 900° C. for about 7 minutes), versus about 800° C. to about 1000° C. for about 1 minute to about 20 minutes to form second gate dielectric layer 130 (e.g. about 900° C. for about 3 minutes). Thus, by performing transistor channel implants after formation of first gate dielectric layer 108, the present methodology provides for transistor channel implants to be subjected only to the less severe heat cycling necessary to form thinner second gate dielectric layer 130.

The final thicknesses of first and second gate dielectric layers 108, 130 are determined by the electrical characteristics of the semiconductor device and the voltage its I/O circuits are required to handle. For example, in a high-speed microprocessor with a design rule of 0.25 µm, if the first and second gate dielectric layers 108, 130 are silicon dioxide, second gate dielectric layer 130 is typically about 30 Å to about 40 Å thick, while first gate dielectric layer 108 could be about twice as thick (e.g., about 60 Å to about 80 Å thick). Furthermore, the final thickness of first gate dielectric layer 108 is the sum of its initial thickness (as shown in FIG. 1B), less the amount of its thickness that is removed during the HF dip after it has been etched and mask 128 has been stripped off (e.g., about 20 Å of thickness can be lost), plus the thickness added during the formation of second gate dielectric layer 130 (e.g., if second gate dielectric layer 130 is thermally grown to a thickness of about 40 Å, about 30 Å of thickness will be added to first gate dielectric layer 108).

In other embodiments of the invention, the first gate dielectric layer 108 is thermally grown silicon dioxide and the second gate dielectric layer 130 is deposited silicon dioxide, or both gate dielectric layers 108, 130 are deposited. In these embodiments, second gate dielectric layer 130 will be deposited to the same thickness on top of first gate dielectric layer 108 as on exposed portions 104a of active area 104. Thus, the final thickness of first gate dielectric layer 108 in these embodiments is the sum of its initial thickness (as shown in FIG. 1B), less the amount of its thickness that is removed during the HF dip after it has been etched and mask 128 has been stripped off, plus the full thickness of deposited second gate dielectric layer 130. These factors must be considered when designing the dual gate dielectric process flow.

In the embodiment of the present invention described in detail above, well implant 112, field implant 116, punch-through implants 118, 124 and threshold adjust implants 120, 126 are performed after formation of first gate dielectric layer 108. However, the unwanted diffusion resulting from an extra heat cycle is most critical for the threshold adjust and punch-through implants and least critical for the field and well implants. Thus, in another embodiment of the present invention, well and field implants 112, 116 are formed prior to the growth of first gate dielectric layer 108, and only threshold and punch-through implants 118, 120, 124, 126 are formed through first gate dielectric layer 108, without an unacceptable adverse affect on the performance of the finished device.

The inventive methodology enables the production of a dual gate dielectric CMOS device with minimal disturbance of the dopant profile of the channel implants by performing critical transistor channel implantations after the formation of the thicker of the two gate dielectric layers. In this way, the transistor channel dopants are not subjected to two heat cycles, but only to a single heat cycle, thus minimizing unwanted diffusion of the dopants. Moreover, because the transistor channel implants, which can degrade gate dielectric quality, are performed through the thicker of the two gate dielectrics, whose integrity is inherently greater that of the thin gate dielectric, the channel implantations do not unduly degrade the gate dielectric quality. The present invention is applicable to the manufacture of various types of semiconductor devices having LOCOS or STI, particularly high density semiconductor devices having a design rule of about 0.25µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a field oxide region to isolate an active area on a main surface of a semiconductor substrate;

forming a first gate dielectric layer on the active area;

implanting impurities into the substrate through the first gate dielectric layer;

forming a mask on the first gate dielectric layer, the mask having openings over portions of the active area;

etching the first gate dielectric layer to expose the portions of the active area; and forming a second gate dielectric layer on the exposed portions of the active area to a thickness less than a thickness of the first gate dielectric layer, wherein said first gate dielectric layer is formed to a first thickness in an approximately 20% oxygen atmosphere at about 800° C. to about 1000° C. for about 20 seconds to about 10 minutes and wherein said second gate dielectric layer is formed to a second thickness in an approximately 50% N$_2$O atmosphere at about 800° C. to about 1000° C. for about 2 minutes to about 45 minutes.

2. The method according to claim 1, comprising implanting impurities through the first gate dielectric layer to form a threshold adjust implant.

3. The method according to claim 1, comprising implanting impurities through the first gate dielectric layer to form a punch-through implant.

4. The method according to claim 1, comprising implanting impurities through the field oxide into the substrate after forming the first gate dielectric layer to form a field implant.

5. The method according to claim 1, comprising implanting impurities through the first gate dielectric layer to form a well implant.

6. The method according to claim 1, comprising:
   implanting impurities into the substrate prior to forming the first gate dielectric layer to form a well implant and a field implant; and
   implanting impurities through the first gate dielectric layer to form a punch-through implant and a threshold adjust implant.

7. The method according to claim 1, comprising:
   forming a photoresist mask on the first gate dielectric layer;
   removing the photoresist mask after etching the first gate dielectric layer; and
   cleaning the exposed portions of the active area and the first gate dielectric layer before forming the second gate dielectric layer.

8. The method according to claim 7, comprising cleaning by dipping in hydrofluoric acid.

9. The method according to claim 7, wherein the first gate dielectric layer has a thickness of about 60 Å to about 80 Å after the second gate dielectric is formed, and the second gate dielectric layer has a thickness of about 30 Å to about 40 Å.

10. The method according to claim 1, comprising:
    forming a sacrificial oxide layer on the field oxide region and the active area prior to forming the first gate dielectric layer; and
    removing the sacrificial oxide layer before forming the first gate dielectric layer.

11. The method according to claim 1, comprising forming the first and second gate dielectric layers of silicon dioxide by thermal oxidation.

12. The method according to claim 11, comprising forming the first gate dielectric layer in an oxygen atmosphere.

13. The method according to claim 12, comprising forming the second gate dielectric layer in an N$_2$O atmosphere.

14. The method according to claim 11, comprising:
    forming the first gate dielectric layer to a first thickness in an oxygen atmosphere; and
    forming the second gate dielectric layer to a second thickness in an N$_2$O atmosphere.

15. The method according to claim 11, comprising forming the first gate dielectric layer at a temperature of about 800° C. to about 1000° C. for about 2 minutes to about 45 minutes, and forming the second gate dielectric layer at a temperature of about 800° C. to about 1000° C. for about 1 minute to about 20 minutes.

16. The method according to claim 15, comprising forming the first gate dielectric layer at a temperature of about 900° C. for about 7 minutes, and forming the second gate dielectric layer at a temperature of about 900° C. for about 3 minutes.

17. The method according to claim 1, comprising:
    forming the second gate dielectric layer to the first thickness in an approximately 20% oxygen atmosphere at about 900° C. for about 1.5 minutes; and
    forming the second gate dielectric layer to the second thickness in an approximately 50% N$_2$O atmosphere at about 900° C. for about 10 minutes.

18. The method according to claim 1, comprising forming the first and second gate dielectric layers by deposition silicon dioxide.

19. The method according to claim 1, comprising forming the field oxide region by one of LOCOS and STI.

20. The method according to claim 1, comprising forming the first and second gate dielectric layers of one of silicon dioxide, silicon nitride and tantalum oxide.

* * * * *